United States Patent
Raidl et al.

(10) Patent No.: US 7,884,680 B2
(45) Date of Patent: Feb. 8, 2011

(54) DYNAMICALLY ADJUSTABLE Q-FACTORS

(75) Inventors: Alfred Raidl, Rosenau (AT); Christoph Schmits, Bochum (DE); Wolfgang Thomann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 12/164,411

(22) Filed: Jun. 30, 2008

(65) Prior Publication Data

US 2009/0322445 A1    Dec. 31, 2009

(51) Int. Cl.
    *H03B 5/08* (2006.01)
(52) U.S. Cl. .......... 331/167; 331/36 C; 331/117 FE; 331/117 R; 331/177 R; 331/187; 334/40; 329/334; 329/339; 329/320; 455/114.2; 455/120; 455/125; 455/317
(58) Field of Classification Search .......... 329/334, 329/339, 320; 334/40; 331/36 C, 117 FE, 331/117 R, 167, 187, 177 R; 445/114.2, 445/120, 125, 317
See application file for complete search history.

(56) References Cited

U.S. PATENT DOCUMENTS

| | | | | |
|---|---|---|---|---|
| 3,649,929 A * | 3/1972 | Thompson | ........ | 331/61 |
| 4,270,102 A * | 5/1981 | Gawler et al. | ........ | 331/115 |
| 4,492,934 A * | 1/1985 | Sugimoto | ........ | 331/117 R |
| 4,520,328 A * | 5/1985 | Murakami et al. | ........ | 332/155 |
| 4,706,045 A * | 11/1987 | Ouyang et al. | ........ | 331/117 FE |
| 5,151,667 A * | 9/1992 | Nishijima | ........ | 331/117 R |
| 5,416,448 A * | 5/1995 | Wessendorf | ........ | 331/116 R |
| 5,418,497 A * | 5/1995 | Martin | ........ | 331/48 |
| 6,066,991 A * | 5/2000 | Naito et al. | ........ | 331/75 |
| 6,731,182 B2 * | 5/2004 | Sakurai | ........ | 331/177 V |
| 6,759,915 B2 * | 7/2004 | Akatsuka | ........ | 331/179 |
| 2005/0275490 A1 | 12/2005 | Luh | | |
| 2006/0017515 A1 | 1/2006 | Stanic et al. | | |
| 2006/0097811 A1 * | 5/2006 | Nakamura et al. | ........ | 331/167 |
| 2006/0132229 A1 * | 6/2006 | Kawakubo et al. | ........ | 329/313 |
| 2007/0013451 A1 * | 1/2007 | Luzzatto et al. | ........ | 331/16 |
| 2007/0030103 A1 | 2/2007 | Lin et al. | | |
| 2007/0069831 A1 * | 3/2007 | Kwasniewski et al. | ........ | 331/167 |
| 2008/0266011 A1 * | 10/2008 | Kuosmanen | ........ | 331/175 |

OTHER PUBLICATIONS

*Low Power RF Filtering for CMOS Transceivers*, Chapter 5: "Quality Factor Tuning", Kåre Tais Christensen, Sep. 2001, pp. 109-122.

(Continued)

Primary Examiner—Arnold Kinkead
Assistant Examiner—Richard Tan
(74) Attorney, Agent, or Firm—Eschweiler & Associates, LLC

(57) ABSTRACT

One embodiment relates to a circuit for active loss compensation. The circuit includes a parallel inductor-capacitive (LC) tank circuit having a first single-ended output. A first adjustable capacitor, which includes a first terminal and a second terminal, is coupled to the first single-ended output. The circuit also includes a first pair of transistors having sources coupled to a first common node. One transistor of the first pair of transistors has a drain coupled to the first single-ended output and the other transistor of the first pair of transistors has a gate coupled to the second terminal of the first adjustable capacitor. Other embodiments are also disclosed.

18 Claims, 5 Drawing Sheets

OTHER PUBLICATIONS

"A 200 MHz CMOS Q-Enhanced LC Bandpass Filter", William B. Kuhn, F. William Stephenson and Aicha Elshabini-Raid, IEEE Journal of Solid-State Circuits, vol. 31, No. 8, Aug. 1996, 11 pgs.

"Q-Enhanced LC Bandpass Filters for Integrated Wireless Applications", William B. Kuhn, Naveen K. Yanduru and Adam S. Wyszynski, IEEE Transactions on Microwave Theory and Techniques, vol. 46, No. 12, Dec. 1998, 10 pgs.

"A CMOS Q-Enhancement Bandpass-Filter for use in Paging Receivers", J. Tangenberg, E.A.M. Klumperink, J.W. TH Eikenbrock and B. Nauta, STW, 1998, 6 pgs.

* cited by examiner

DYNAMICALLY ADJUSTABLE Q-FACTORS

FIELD OF DISCLOSURE

The present invention relates generally to circuits and methods related to adjustable Q-factors.

BACKGROUND

In physics and engineering, the quality factor (or "Q-factor") of an oscillating system is a dimensionless parameter that compares a time constant for amplitude decay to oscillation period. Equivalently, the Q-factor compares the frequency at which the system oscillates to the rate at which it dissipates its energy. For example, a pendulum oscillating in air would have a high-Q factor, while a pendulum oscillating in oil would have a low-Q factor.

In electronics, when a resonant filter is driven by a sinusoidal signal, its resonant behavior depends strongly on its Q-factor. Resonant filters respond to frequencies close to their resonant frequency more strongly than they respond to non-resonant frequencies, and their response falls off more rapidly as the driving frequency moves away from resonance. Thus, a radio receiver with a high-Q factor filter in its signal path is difficult to tune when compared to a low-Q factor filter, but once tuned does a better job of filtering out other nearby and far-off frequencies.

Whenever the achievable Q-factor is limited due to technology constraints, it can be increased by means of special circuits—namely Q-enhancement or loss compensation circuits. Usually, the employment of these circuits leads to extra power consumption.

As will be appreciated from the above discussion and embodiments described herein, there is an on-going need for circuits that provide a good blend between ease of tuning, good filtering characteristics, and power consumption.

SUMMARY

The following presents a simplified summary in order to provide a basic understanding. This summary is not an extensive overview, and is not intended to identify key or critical elements. Rather, the primary purpose of the summary is to present some concepts in a simplified form as a prelude to the more detailed description that is presented later.

One embodiment relates to a filter circuit having an adjustable Q-factor. The circuit includes a parallel inductor-capacitive (LC) tank circuit having a first single-ended output. A first adjustable capacitor has a first terminal coupled to the first single-ended output. The circuit also includes a first pair of transistors having sources coupled to a first common node. One transistor of the first pair of transistors has a drain coupled to the first single-ended output and the other transistor of the first pair of transistors has a gate coupled to a second terminal of the first adjustable capacitor. The two transistors together with the tank circuit form a closed amplification loop which counteracts the loss mechanisms of the tank inductor and/or the tank capacitor.

The following description and annexed drawings set forth in detail certain illustrative aspects and implementations. These are indicative of only a few of the various ways in which the principles set forth may be employed.

DETAILED DESCRIPTION

Figure 1:
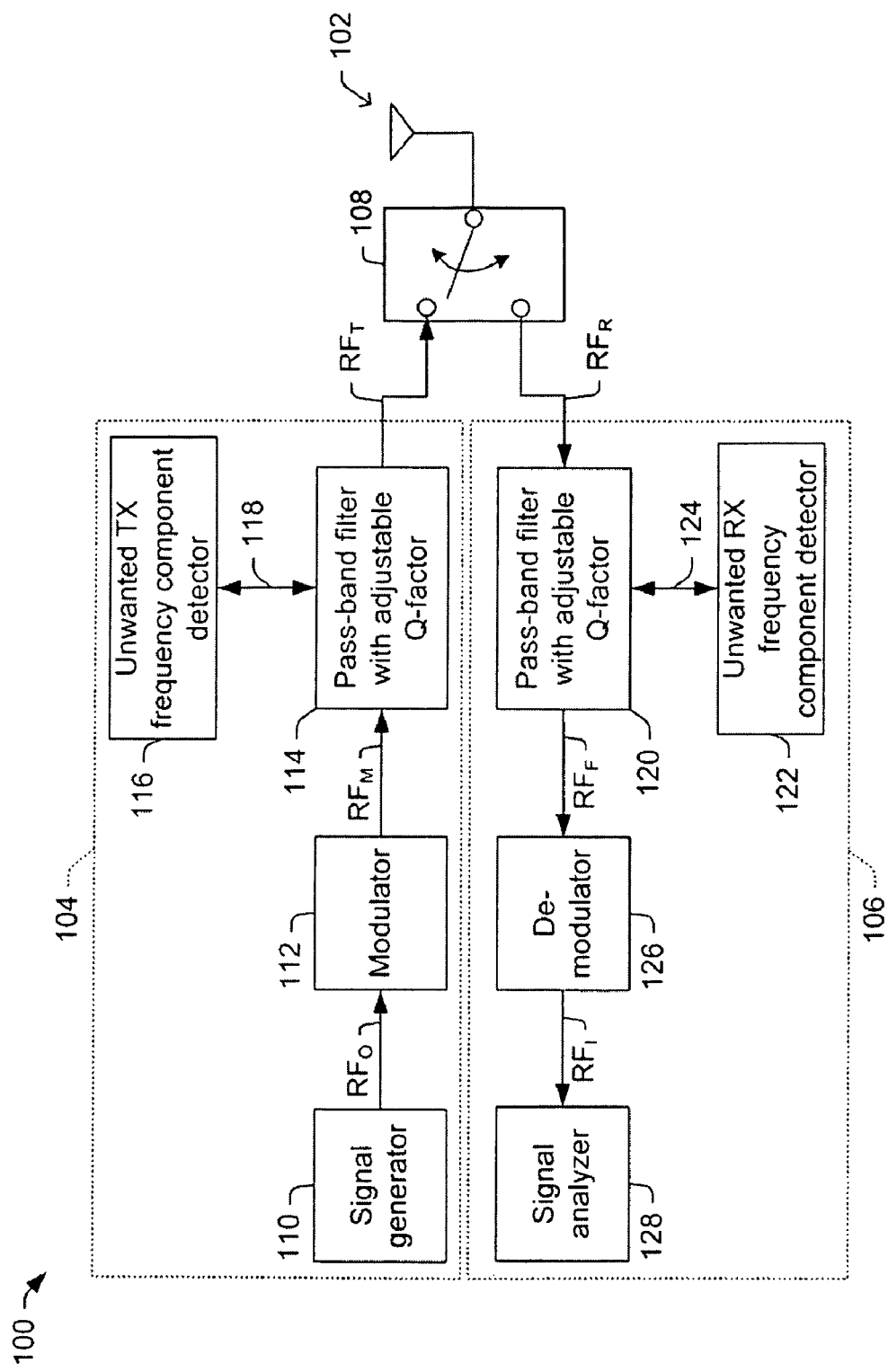
FIG. 1 is a schematic diagram illustrating a transceiver that includes band pass filters with adjustable Q-factors.

One or more implementations of the present invention will now be described with reference to the attached drawings, wherein like reference numerals are used to refer to like elements throughout.

In several embodiments below, resonant circuits having an adjustable Q-factor are illustrated and described. In some embodiments, one or more adjustable capacitors in a resonant circuit can be adjusted to dynamically adjust the Q-factor; the adjustment can also be achieved by an adjustable W/L ratio of the employed active (amplification) devices. By dynamically adjusting the Q-factor, the resonant circuits can provide a balance between performance tradeoffs, such as between precise filtering and power consumption. Some more detailed embodiments for resonant circuits with adjustable Q-factors will be described further herein (see e.g., FIGS. 4-5), but first an example of a context where these resonant circuits can be used is set forth.

To illustrate one manner in which adjustable Q-factor circuits may be used, FIG. 1 shows a transceiver 100 (i.e., transmitter and receiver) that communicates via an antenna 102. The transceiver 100 includes a transmission path 104 for generating a transmission radio frequency signal ($RF_T$) and a reception path 106 for receiving a reception radio frequency signal ($RF_R$). Depending on whether data is being transmitted or received, a switch 108 selectively couples the transmission path 104 or the reception path 106 to the antenna 102. For purposes of clarity and simplicity, the switch 108 is shown as switching between only two positions, but in more practical solutions the switch 108 has other positions or could be a duplexer as in a CDMA system.

During transmission, a signal generator 110 generates an outgoing signal, $RF_O$, over one of several frequency channels. Based on $RF_O$, the modulator 112, which could be a power amplifier in one embodiment, generates a modulated signal, $RF_M$. This signal $RF_M$ can include several frequency components (e.g., a wanted frequency component and an unwanted frequency component).

This modulated signal $RF_M$ is provided to the bandpass filter 114. Ideally, the bandpass filter 114 would completely pass the wanted frequency component (i.e., zero attenuation), and would completely block the unwanted signal (i.e., infinite attenuation). Thus, the transmission signal, $RF_T$, would ideally include only the wanted frequency component. However, in practical circuits some of the unwanted frequency component may pass through the bandpass filter 114 and some of the wanted frequency component may be inadvertently attenuated.

To limit the unwanted frequency component to an acceptable level that won't result in data errors, an unwanted TX frequency component detector 116 can monitor $RF_M$ and/or $RF_T$ to compare the unwanted frequency component to a threshold value. This monitoring can be done by directly measuring a magnitude of the unwanted frequency component, but can also be done indirectly (e.g., by measuring the signal-to-noise ratio, bit error rate, or error vector magnitude=EVM of the wanted signal). In any event, based on the threshold comparison, the unwanted TX frequency component detector 116 provides feedback 118 to the bandpass filter 114, which can adjust its Q-factor accordingly.

Somewhat similar functionality is shown on the reception path 106, where a received RF signal, $RF_R$, will include wanted and unwanted frequency components. The bandpass filter 120, which attenuates unwanted frequency components and passes the wanted frequency components, generates a filtered signal $RF_F$. If the unwanted frequency components in $RF_R$ or $RF_F$ exceed a threshold, the unwanted RX frequency component detector 122 will provide feedback 124 to the bandpass filter 120 to adjust its Q-factor. The demodulator 126 will demodulate the filtered signal $RF_F$, after which the signal analyzer 128 will evaluate the incoming signal $RF_I$.

Figure 2:
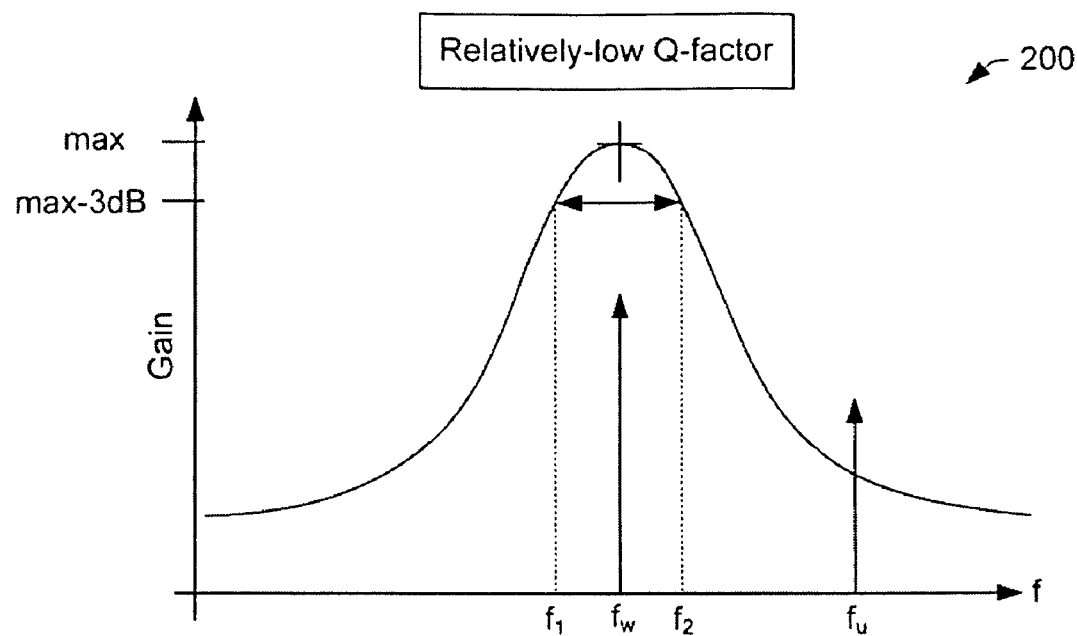
FIG. 2 depicts a filter characteristic with a relatively low Q-factor.
Figure 3:
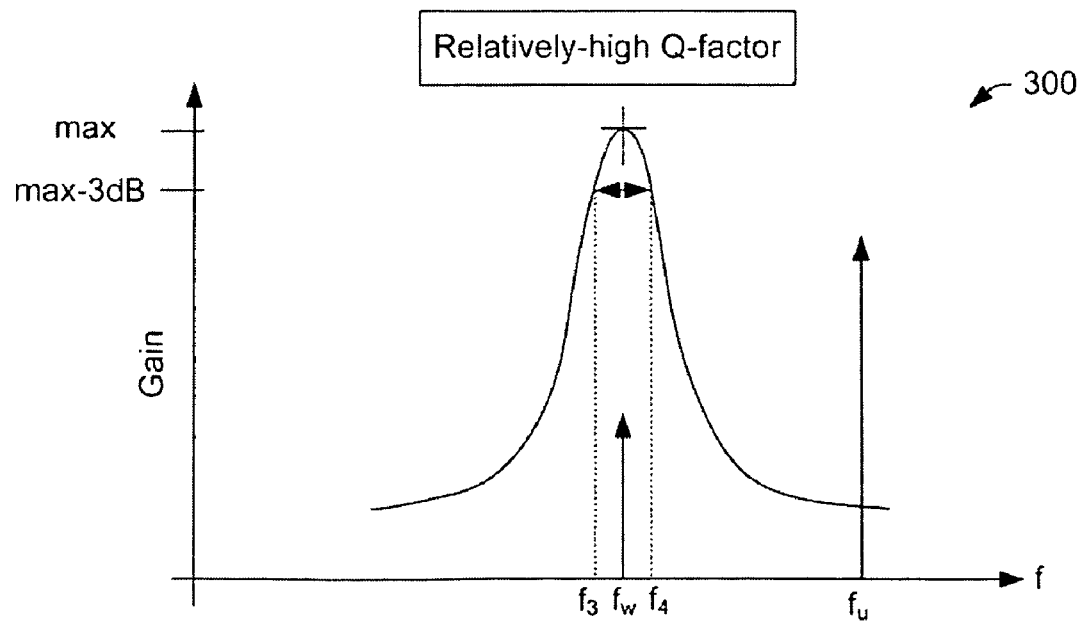
FIG. 3 depicts a filter characteristic with a relatively high Q-factor.

FIGS. 2-3 show a more detailed depiction of the filtering process, where FIG. 2 shows a filter characteristic 200 with a relatively low Q-factor and FIG. 3 shows a filter characteristic 300 with a relatively high Q-factor. It will be understood that the terms "relatively-low" and "relatively-high" are used to describe relative relationships between features within this specification, and not necessarily in a more global sense. Further, although only two Q-factors are shown, it will be appreciated that some pass-band filters could dynamically adjust their Q-factors to dynamically vary between any number of Q-factors.

In both FIGS. 2-3, the pass-band of the filter is centered about the wanted frequency component, $f_w$, which may also be referred to as a resonant frequency component. Therefore the wanted frequency component, $f_w$, passes through the pass-band filter 114 or 120 with little or no attenuation (relatively high gain). In contrast, the unwanted frequency component, $f_u$ (which may also be referred to as a non-resonant frequency component), is offset relative to the center of the passband, causing the pass-band filter 114 or 120 to substantially attenuate the unwanted frequency component. As mentioned, if the unwanted frequency component detector 116 or 122 determines the unwanted frequency component unfavorably compares to the threshold value, the feedback can adjust the Q-factor. For example, if the unwanted frequency component is too high, the Q-factor can be increased, which narrows the pass-band of the band-pass filter and provides more precise filtering. In this manner, the unwanted frequency component can be further attenuated.

While an increase in Q-factor may be advantageous to further attenuate unwanted frequency components, it may cause the bandpass filter 114 or 120 to consume more power. Therefore, if an unwanted frequency component detector 116 or 122 determines that the Q-factor can be reduced and still provide adequate signal processing, it may provide feedback to reduce the Q-factor so that power consumption is correspondingly reduced. This dynamically adjustable Q-factor enables a mobile communication device associated with the transceiver 100 to provide a good balance between power consumption (e.g., longer battery life for the mobile device) and signal quality (e.g., voice clarity on the mobile device).

Now that one example of a resonant circuit has been described, several more detailed embodiments of resonant circuits having adjustable Q-factors are now discussed with reference to FIGS. 4-5 In some embodiments, these circuits could be used as bandpass filter 114 or 120, but in other embodiments these circuits could be used for other applications. For example, these circuits could also be used for notch filters or coupled-resonant filters (or any other kind of filter that uses at least one inductor), analog-to-digital conversion, narrowband amplifiers, and microwave circuits, among others.

Figure 4:
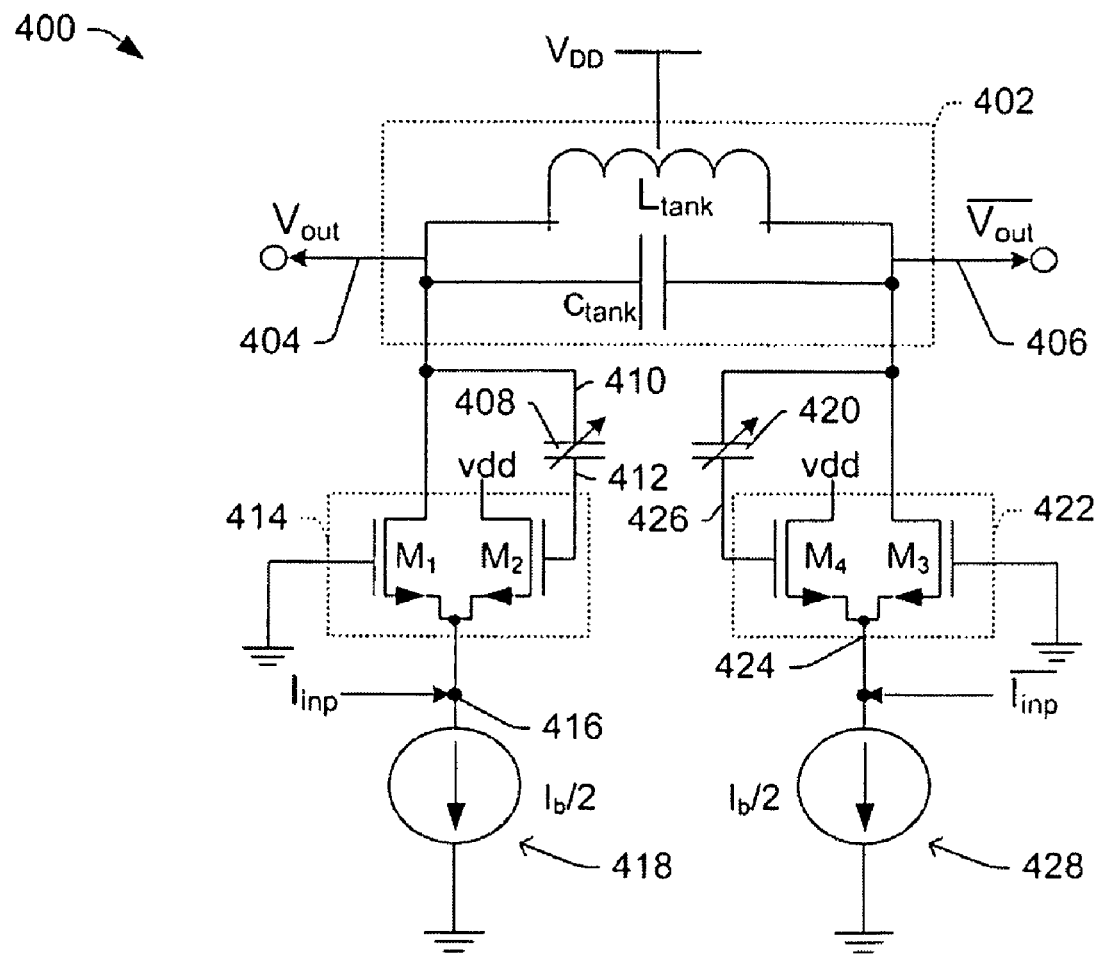
FIG. 4 is shows an embodiment of a differential circuit with an adjustable Q-factor.

FIG. 4 depicts one embodiment of a differential circuit 400 with an adjustable Q-factor. The differential circuit 400 includes a parallel inductor-capacitive (LC) tank circuit 402 having a first single-ended output 404 and a second single-ended output 406. A first adjustable capacitor 408 includes a first terminal 410 and a second terminal 412. The first terminal 410 is coupled to the first single-ended output 404. A first pair of transistors 414 have sources coupled to a first common node 416. One transistor M1 of the first pair of transistors has a drain coupled to the first single-ended output 404 and a gate coupled to ac-ground (having dc bias). The other transistor M2 has a gate coupled to the second terminal 412 of the first adjustable capacitor 408. The first common node 416 receives an input current signal $I_{inp}$, which is typically a modulated sinusoidal input, and is associated with a first current source 418 that is coupled to ground.

In addition, the differential circuit 400 also includes a second adjustable capacitor 420 and a second pair of transistors 422. The transistors M3, M4 in the second pair of transistors have sources coupled to a second common node 424. One transistor M3 has a drain coupled to the second single-ended output 406, and the other transistor M4 has a gate coupled to the second terminal 426 of the second adjustable capacitor 420. The second common node 424 is driven by an input current signal $\overline{I_{inp}}$, which is typically a modulated sinusoidal input that is 180° phase shifted relative to $I_{inp}$, and is associated with a second current source 428 that is coupled to ground.

During operation, the parallel LC tank circuit 402 is set to resonate at the wanted frequency. Thus, the parallel LC tank circuit 402 will tend to amplify the wanted frequency component and attenuate unwanted frequency components. Depending on the desired Q-factor for the circuit, the first and second adjustable capacitors 408, 420 can be adjusted based on feedback without changing the operating point of the circuit (e.g., feedback can be supplied by an unwanted frequency component detector 116 or 122). If it is desired that the Q-factor be increased, the capacitance of the first and second adjustable capacitors 408, 420 can be increased. Conversely, to decrease the Q-factor, the capacitance of the first and second adjustable capacitors 408, 420 can be decreased. In some embodiments, the capacitor $C_{tank}$ can also be adjustable, thereby allowing the circuit 400 to adjust to different wanted frequencies.

In some embodiments, each of these adjustable capacitors 408, 420 (and optionally $C_{tank}$) can be implemented as a bank of several capacitors with switching elements respectively associated therewith. Thus, if more capacitance is desired, more capacitors in the bank can be coupled together. Additionally, in some embodiments the first and second adjustable capacitors 408, 420 can be made with the same process technology as the tank capacitor $C_{tank}$, which provides a process independent way to counteract detuning of the tank due to changes in the first and second adjustable capacitors 408, 420.

In other embodiments, the q-factor of the circuit can be adjusted by tuning the effective width-to-length (W/L) ratios of the transistors. This can be achieved dynamically by switching parallel transistors on and off. For example, the W/L ratio will be effectively larger if all gates and sources are connected together, and will conversely be effectively smaller if fewer gates and sources are connected together. In one embodiment, switching a drain to VDD could turn the device on, and switching a drain to ground could turn the device off.

In one embodiment, the final Q-factor for the circuit 400 is proportional to the enhancement loop gain according to the following relation:

loop gain=>($g_m$ of M1)*(load impedance)*(feedback factor)*($g_m$ of M2)/($g_m$ of M1+$g_m$ of M2)

where the load impedance equals the impedance of LC-tank; $g_m$ represents the transconductance of the corresponding transistor; and the feedback factor is equal to capacitive division of the adjustable capacitor (408 or 420) and input capacitance of transistor (M2 or M4, respectively). Thus loop gain can be set by the first or second adjustable capacitor 408, 420 or any other component in the loop, like the $g_m$ of the transistors (via transistor width-to-length ratio (W/L) or current, or both).

Adjusting the capacitance of the first and/or second adjustable capacitors 408, 420 does not change the dc-operating point of the transistors, and thus causes little nonlinear change in their capacitance. The LC tank is loaded by the first and second adjustable capacitors (in series with the input capacitance of M2 and M4), i.e. is part of the overall tank-capacitance, however, in a predictable manner (given by equation above). Changing the capacitance of the adjustable capacitors will somewhat alter the tank-capacitance and results in a small center frequency shift. Since the two effects cause small changes and predictable changes the center frequency can be easily corrected by altering $C_{tank}$ correspondingly.

Adjusting the current and, thus, the operating point of the transistors has a larger effect on the center frequency but allows current reduction if lower Q values are required.

In one embodiment, e.g. manufactured in a C65 CMOS technology, the circuit 400 could have circuit values as follows: $L_{tank}$ is approximately 1.7 nH; $C_{tank}$ is approximately 3.66 pF; the first and second adjustable capacitors 408, 420 range from approximately 220 pF to approximately 1.7 pF; and $l_b/2$ from approximately 10 mA to approximately 16 mA. In addition the transistors M1 and M2 could have width to length ratios $W_{M1}/L_{M1}$ of approximately 300 μm/230 nm, and $W_{M2}/L_{M2}$ of approximately 225 μm/230 nm. In this embodiment, the Q-factor could range from approximately 10 (Q-factor of tank without enhancement) to approximately 50 in a frequency range from 1.8 GHz to 2.2 GHz. It will be appreciated that these values illustrate merely a very narrow example of one manner in which the circuit could be designed, and that other values could be selected to meet the design constraints for other applications.

Figure 5:
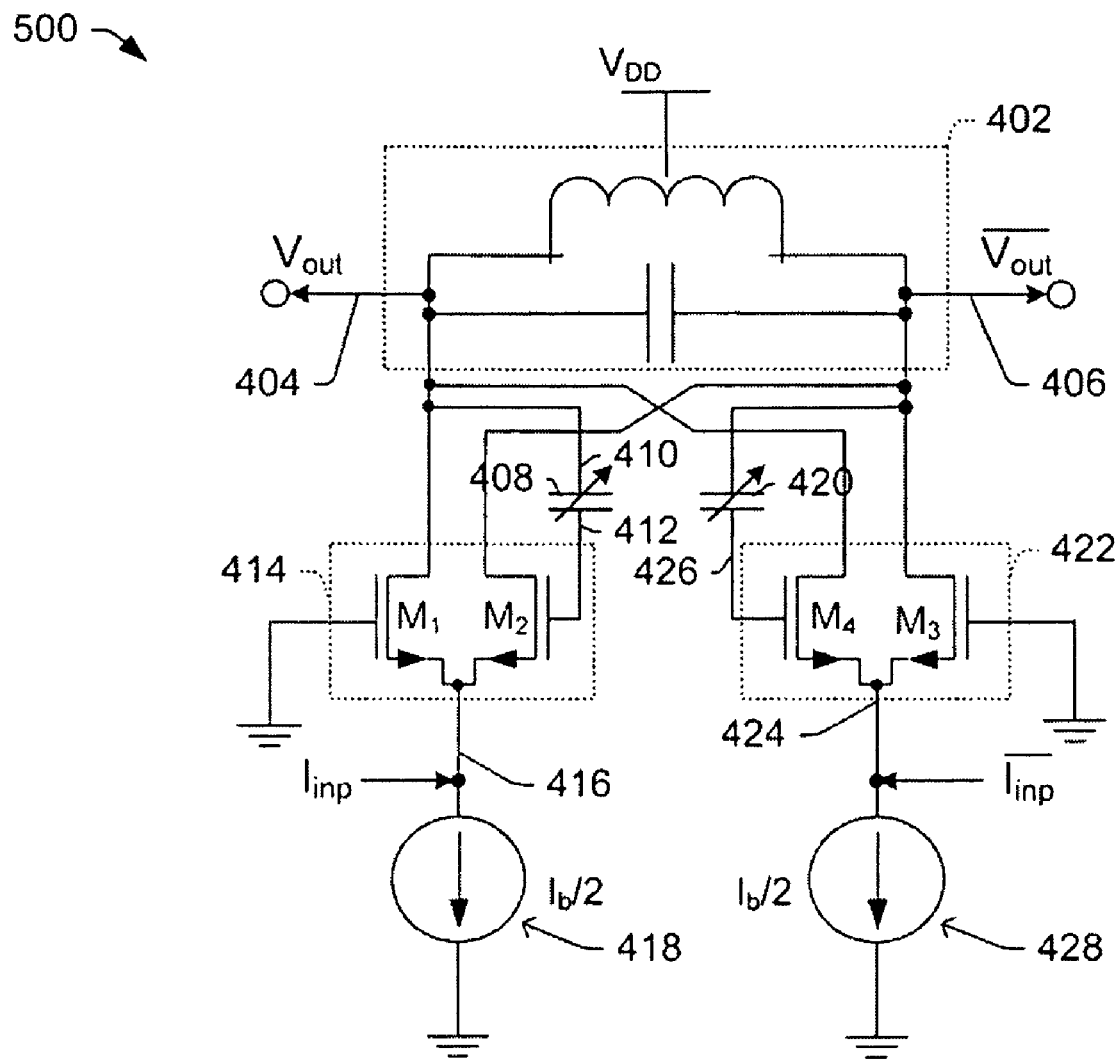
FIG. 5 is shows an embodiment of a cross-coupled differential circuit with an adjustable Q-factor.

FIG. 5 depicts an embodiment of a cross-coupled differential circuit 500 with an adjustable Q-factor. In this embodiment, one transistor M1 of the first pair of transistors has a drain coupled to the second single-ended output 406, and one transistor M3 of the second pair of transistors has a drain coupled to the first single-ended output 404. The other transistor M2 of the first pair of transistors has a drain that is also coupled to the second single-ended output 406. The other transistor M4 of the second pair of transistors has a drain that is also coupled to the first single-ended output 404. This embodiment may provide better Q-factor enhancement efficiency relative to earlier embodiments. This embodiment utilizes the available signal current of M2 and M4 to achieve a higher output signal, i.e. a higher loop gain and thus, higher Q values with the same current (or conversely lower current consumption for a given Q value).

Although FIGS. 4-5 have illustrated and described some structural features of various examples, alterations and/or modifications may be made to these examples without departing from the spirit and scope of the appended claims. For example, although these circuits are illustrated in a differential configuration, they could also be implemented in a single-ended configuration. In addition, although each transistor is illustrated and described above as a metal-oxide semiconductor field effect transistor (MOSFET) with a source, drain, and gate, the present disclosure is also applicable to other types of transistors, which are contemplated as legal equivalents. For example, each MOSFET could be replaced by a bipolar junction transistor (BJT) that includes a base, a collector, and an emitter. More generally, each transistor could be replaced by a junction field effect transistor (JFET) or an insulated gate field effect transistor (IGFET), among other types of switching devices. Other switching devices could include high electron mobility transistors (HEMTs), lateral diffused metal oxide semiconductor (LDMOS) transistors, vacuum tubes, among others. In addition, although some transistors may be shown as p-type devices (e.g., PMOS transistors), the disclosure is equally applicable to n-type devices (e.g., NMOS transistors), albeit with opposite biases being applied.

Figure 6:
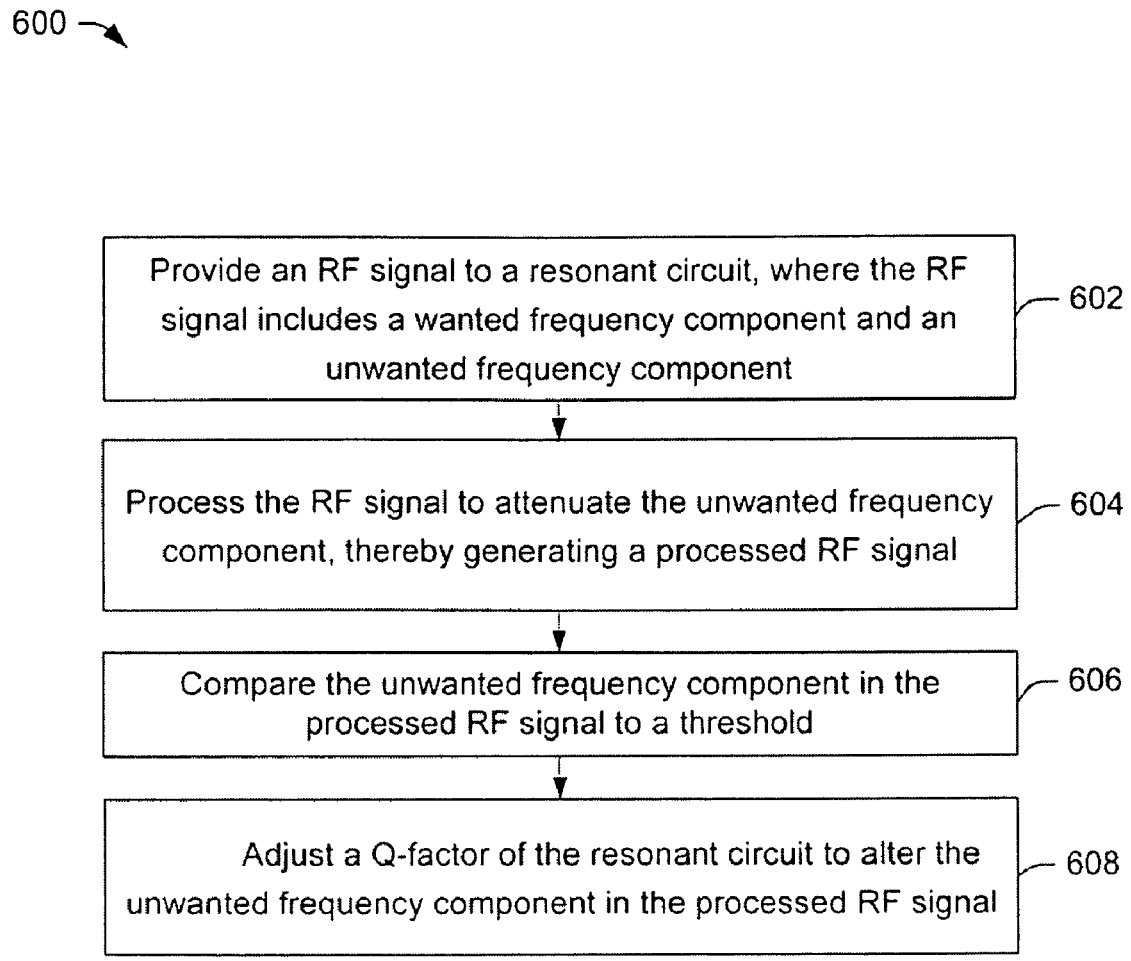
FIG. 6 is a flowchart illustrating a method of adjusting a Q-factor of a circuit.

Referring now to FIG. 6, one can see a method for adjusting a Q-factor in accordance with some aspects of the invention. While the method is illustrated and described below as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases.

In FIG. 6, the method 600 starts at 602 when an RF signal is provided to a resonant circuit. The RF signal includes a wanted frequency component and an unwanted frequency component.

In 604, the RF signal is processed to attenuate the unwanted frequency component, thereby generating a processed RF signal.

In 606, the unwanted frequency component in the processed RF signal is monitored and compared to a threshold value. This monitoring can be performed continuously or can be performed intermittently. For example, the monitoring could be performed each time the mobile communication device boots up, or each time a communication session is initiated.

In 608, based on the comparison, the Q-factor of the resonant circuit is adjusted to alter the unwanted frequency component in the processed RF signal. In some embodiments, this adjustment can include adjusting a capacitance of an adjustable capacitor tied to a single-ended output terminal of the resonant circuit.

In this manner, the resonant circuit can change its Q-factor to account for dynamic operating conditions. For example, the Q-factor can be adjusted to compensate for temperature changes or electrical variations (e.g., battery voltage degradation, or aging effects of the electrical devices.)

Some methods and corresponding features of the present disclosure can be performed by hardware modules, software routines, or a combination of hardware and software. To the extent that software is employed, the software may be provided via a "computer readable medium", which includes any medium that participates in providing instructions to the processor. Such a computer readable medium may take numerous forms, including but not limited to, non-volatile media, volatile media, and transmission media. Non-volatile media includes, for example, optical disks (such as CDs, DVDs, etc.) or magnetic disks (such as floppy disks, tapes, etc.). Volatile media includes dynamic memory, such as ferroelectric memory, SRAM, or DRAM. Transmission media includes coaxial cables, copper wire, fiber optics, etc. that could deliver the instructions over a network or between communication devices. Transmission media can also include electromagnetic waves, such as a voltage wave, light wave, or radio wave.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A mobile communication device, comprising:
   a resonant circuit having an adjustable q-factor, wherein the resonant circuit is adapted to pass a resonant frequency component and attenuate a non-resonant frequency component; and
   a non-resonant frequency component detector adapted to compare the non-resonant frequency component to a threshold, and further adapted to provide feedback to the resonant circuit to dynamically adjust the q-factor based on the threshold comparison.

2. The mobile communication device of claim 1, where the adjustable q-factor is adjusted by adjusting a capacitance of at least one adjustable capacitor associated with the resonant circuit.

3. The mobile communication device of claim 1, where the resonant circuit comprises a parallel-inductive tank circuit associated with a reception path of the mobile communication device.

4. The mobile communication device of claim 3, further comprising: a demodulator that is downstream of a filter, where the demodulator is adapted to de-modulate the resonant frequency component; and a signal analyzer that is downstream of the demodulator, where the signal analyzer is adapted to analyze the demodulated resonant frequency component.

5. The mobile communication device of claim 3, where the resonant circuit comprises the parallel-inductive tank circuit associated with a transmission path of the mobile communication device, further comprising: a signal generator adapted to generate an outgoing signal; and a modulator adapted to modulate the outgoing signal, thereby providing the resonant frequency component and the non-resonant frequency component.

6. The mobile communication device of claim 1, wherein the resonant circuit is adapted to amplify a resonant frequency component.

7. A circuit with an adjustable Q-factor comprising: a parallel inductor-capacitive (LC) tank circuit having a single ended output; an adjustable capacitor having a first terminal and a second terminal, where the first terminal is coupled to the single-ended output; and a pair of transistors having sources coupled to a common node, wherein one transistor of the pair of transistors has a drain coupled to the single-ended output and an other transistor of the pair of transistors has a gate coupled to the second terminal of the adjustable capacitor; where the other transistor has a drain that is directly tied to an approximately constant voltage supply and which receives an approximately constant voltage therefrom, or where the one transistor and the other transistor have different length-to width ratios.

8. A circuit with an adjustable Q-factor, comprising: a parallel inductor-capacitive (LC) tank circuit having a first single-ended output; a first adjustable capacitor having a first terminal and a second terminal, where the first terminal is coupled to the first single-ended output; and a first pair of transistors having sources coupled to a first common node, wherein one transistor of the first pair of transistors has a drain coupled to the first single-ended output and an other transistor of the first pair of transistors has a gate coupled to the second terminal of the first adjustable capacitor; where the parallel LC tank circuit having a second single-ended output, further comprising: a second adjustable capacitor having a first terminal and a second terminal, where the first terminal of the second adjustable capacitor is coupled to the second single-ended output; and a second pair of transistors having sources coupled to a second common node, wherein one transistor of the second pair of transistors has a drain coupled to the second single-ended output and an other transistor M4 of the second pair of transistors has a gate coupled to the second terminal of the second adjustable capacitor.

9. The circuit of claim 8, where the other transistor of the first pair of transistors has a drain that is coupled to an approximately constant voltage supply.

10. The circuit of claim 8, where the other transistor of the first pair of transistors has a drain that is coupled to the second single-ended output.

11. A method for Q-factor adjustment, comprising:
    providing a radio frequency (RF) signal to a resonant circuit having an adjustable Q-factor, where the RF signal includes a wanted frequency component and an unwanted frequency component;
    processing the RF signal to attenuate the unwanted frequency component, thereby generating a processed RF signal;
    comparing the unwanted frequency component in the processed RF signal to a threshold; and
    adjusting the Q-factor of the resonant circuit based on the comparison to alter the unwanted frequency component in the processed RF signal.

12. The method of claim 11, wherein adjusting the Q-factor comprises:
    adjusting a capacitance of an adjustable capacitor associated with the resonant circuit.

13. The method of claim 11, wherein adjusting the Q-factor comprises:
    adjusting an effective width-to-length ratio of at least one transistor in the resonant circuit.

14. The method of claim 11, where processing the RF signal comprises: providing a parallel inductor-capacitive (LC) tank circuit having a first single-ended output, where the parallel LC circuit is tuned to the wanted frequency component.

15. The method of claim 11, where providing the RF signal comprises:
    generating an outgoing signal over one of several transmission frequency channels; and providing the wanted frequency component and the unwanted frequency component by modulating the outgoing signal.

16. The method of claim 11, where providing the RF signal comprises:
receiving the RF signal over an antenna associated with a mobile communication device.

17. A mobile communication device, comprising:
a resonant circuit having an dynamically adjustable q-factor, wherein the resonant circuit is adapted to pass a wanted frequency component and attenuate an unwanted frequency component; and
means for adjusting the Q-factor of the resonant circuit based on a comparison of the unwanted frequency component to a threshold.

18. The mobile communication device of claim 17, where the means for adjusting the Q-factor comprises:
means for comparing the unwanted frequency component to the threshold; and
means for providing feedback to the resonant circuit to dynamically adjust the q-factor based on the threshold comparison.

* * * * *